(12) United States Patent
Chen et al.

(10) Patent No.: US 9,997,480 B2
(45) Date of Patent: Jun. 12, 2018

(54) METHOD OF FORMING A SEMICONDUCTOR DEVICE INCLUDING STRAIN REDUCED STRUCTURE

(71) Applicant: TAIWAN SEMICONDUCTOR MANUFACTURING COMPANY, LTD., Hsinchu (TW)

(72) Inventors: Hsien-Wei Chen, Hsinchu (TW); Ying-Ju Chen, Tuku Township (TW); Tsung-Yuan Yu, Taipei (TW); Yu-Feng Chen, Hsinchu (TW); Tsung-Ding Wang, Tainan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days. days.

(21) Appl. No.: 15/794,357

(22) Filed: Oct. 26, 2017

(65) Prior Publication Data
US 2018/0047686 A1 Feb. 15, 2018

Related U.S. Application Data

(62) Division of application No. 13/448,217, filed on Apr. 16, 2012, now Pat. No. 9,806,042.

(51) Int. Cl.
*H01L 33/48* (2010.01)
*H01L 23/00* (2006.01)

(52) U.S. Cl.
CPC ............. *H01L 24/06* (2013.01); *H01L 24/05* (2013.01); *H01L 24/13* (2013.01); *H01L 24/16* (2013.01); *H01L 2224/0401* (2013.01); *H01L 2224/05008* (2013.01); *H01L 2224/05541* (2013.01); *H01L 2224/05548* (2013.01); *H01L 2224/05552* (2013.01); *H01L 2224/05567* (2013.01);

(Continued)

(58) Field of Classification Search
CPC ....................................................... H01L 33/48
See application file for complete search history.

(56) References Cited

U.S. PATENT DOCUMENTS 7,361,990 B2 4/2008 Lu et al.
2006/0228829 A1 10/2006 Hsu
(Continued)

FOREIGN PATENT DOCUMENTS

JP 2009-218233 9/2009

OTHER PUBLICATIONS

Office Action dated Mar. 2, 2015 from corresponding No. TW 102111094.

*Primary Examiner* — Mohammad Choudhry
(74) *Attorney, Agent, or Firm* — Haupman Ham, LLP

(57) ABSTRACT

A method of forming a device includes forming conductive pads on a semiconductor die. The conductive pads include a first conductive pad having a first width on a first region of the semiconductor die; and a second conductive pad having a second width on a second region of the semiconductor die. The method includes forming bonding pads on a substrate. The bonding pads include a third bonding pad having a third width on a third region of the substrate; and a fourth bonding pad having a fourth width on a fourth region of the substrate. The method further includes forming a conductive material coupled between the first conductive pad and the third bonding pad, and between the second conductive pad and the fourth bonding pad. A ratio A of the first width to the third width is different from a ratio B of the second width to the fourth width.

20 Claims, 11 Drawing Sheets

(52) U.S. Cl.
CPC ............ *H01L 2224/05569* (2013.01); *H01L 2224/05572* (2013.01); *H01L 2224/05644* (2013.01); *H01L 2224/0603* (2013.01); *H01L 2224/06131* (2013.01); *H01L 2224/06133* (2013.01); *H01L 2224/06179* (2013.01); *H01L 2224/1134* (2013.01); *H01L 2224/131* (2013.01); *H01L 2224/13005* (2013.01); *H01L 2224/13022* (2013.01); *H01L 2224/13111* (2013.01); *H01L 2224/13144* (2013.01); *H01L 2224/13147* (2013.01); *H01L 2224/13166* (2013.01); *H01L 2224/13181* (2013.01); *H01L 2224/16145* (2013.01); *H01L 2224/16238* (2013.01); *H01L 2224/81191* (2013.01); *H01L 2924/10253* (2013.01); *H01L 2924/1306* (2013.01)

(56) References Cited

U.S. PATENT DOCUMENTS

| | | |
|---|---|---|
| 2006/0231949 A1 | 10/2006 | Park et al. |
| 2008/0142994 A1 | 6/2008 | Lu et al. |
| 2010/0314756 A1 | 12/2010 | Lii et al. |
| 2011/0101519 A1 | 5/2011 | Hsiao et al. |
| 2012/0161336 A1 | 6/2012 | Lin et al. |
| 2013/0087909 A1 | 4/2013 | Abdul |

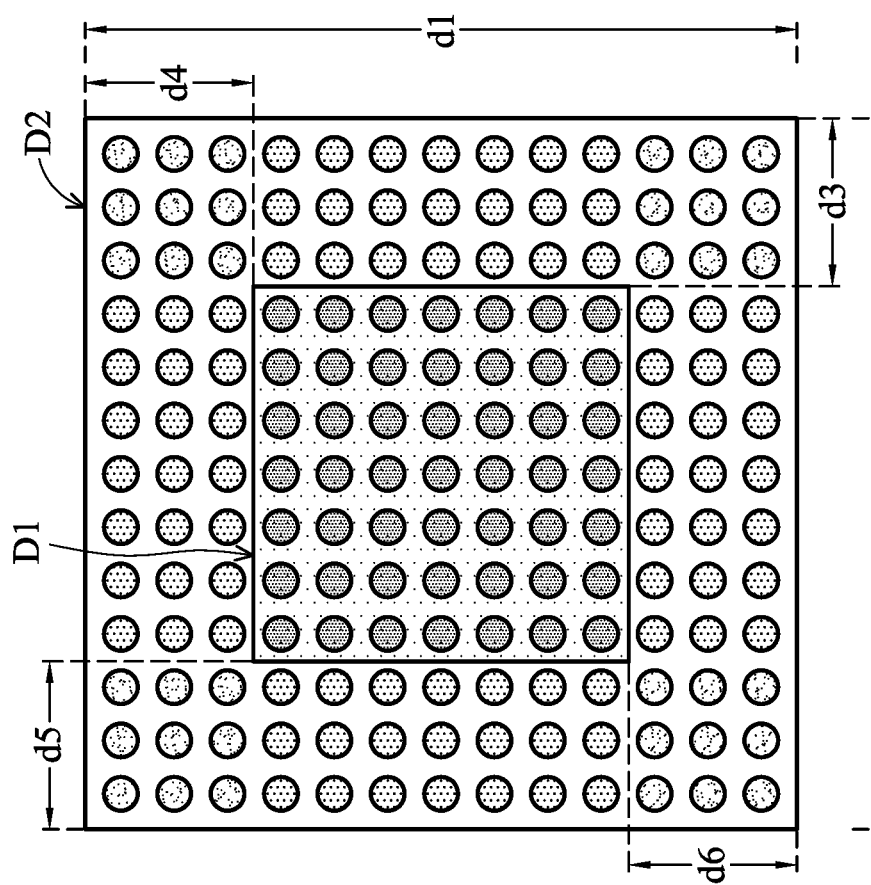

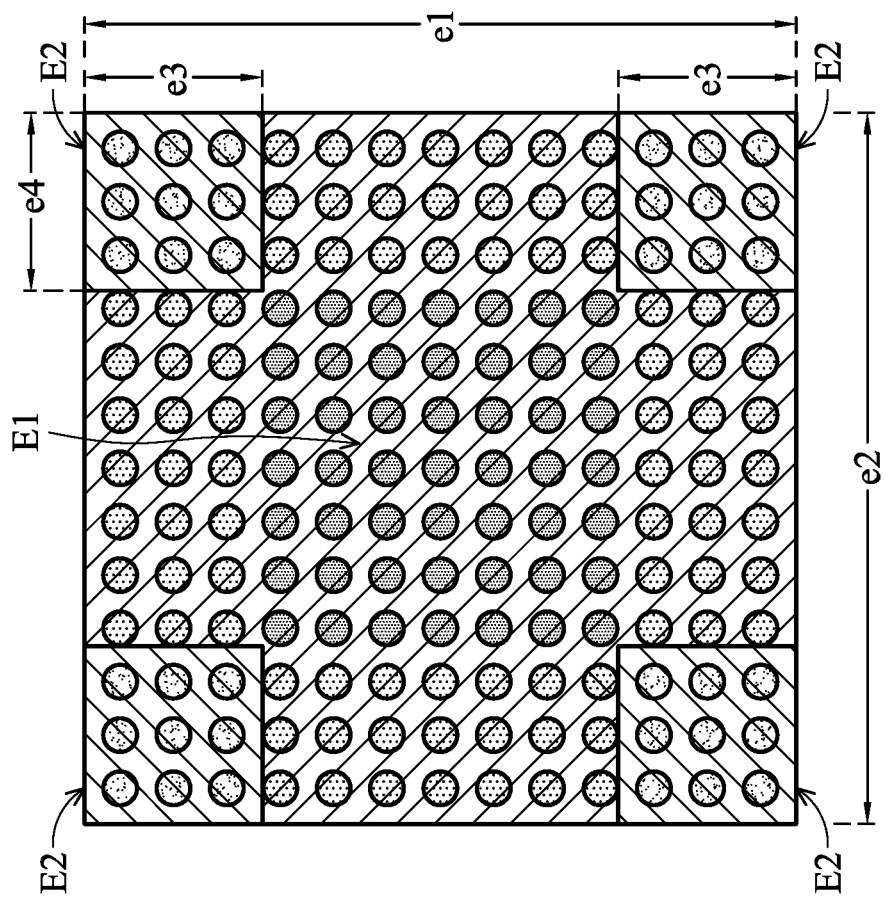

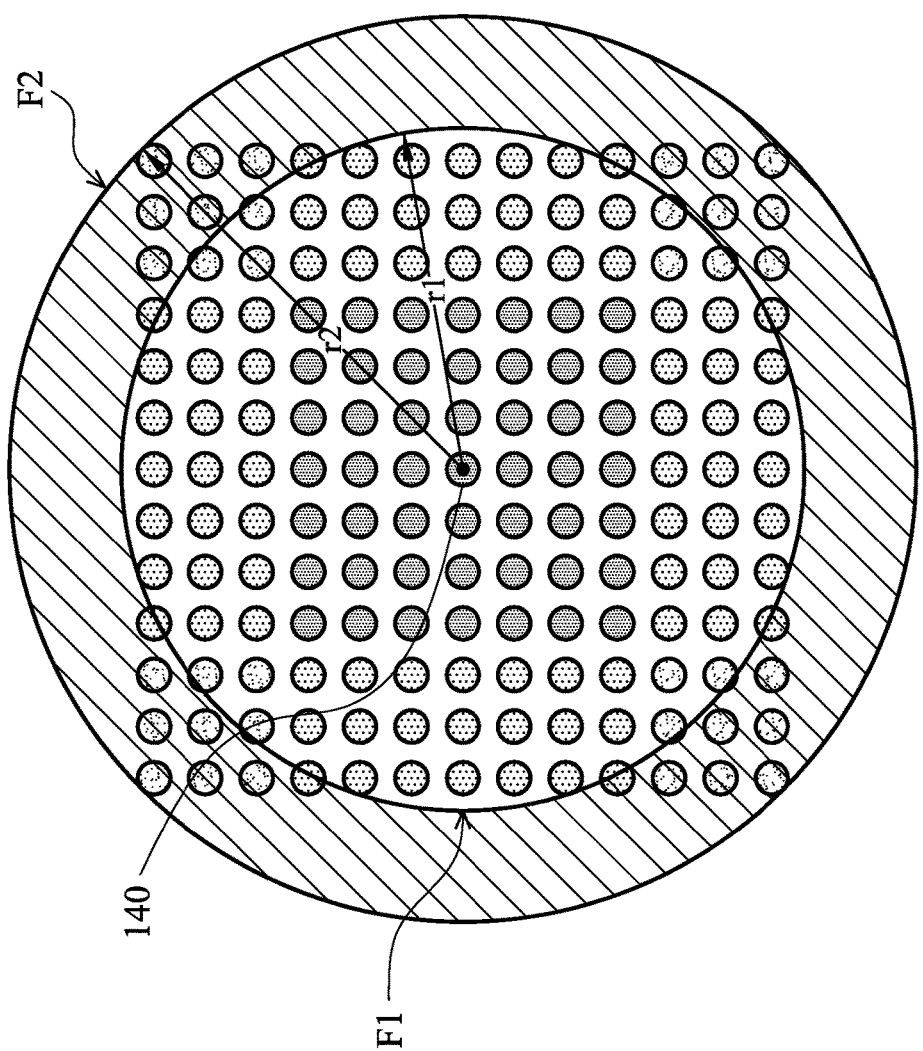

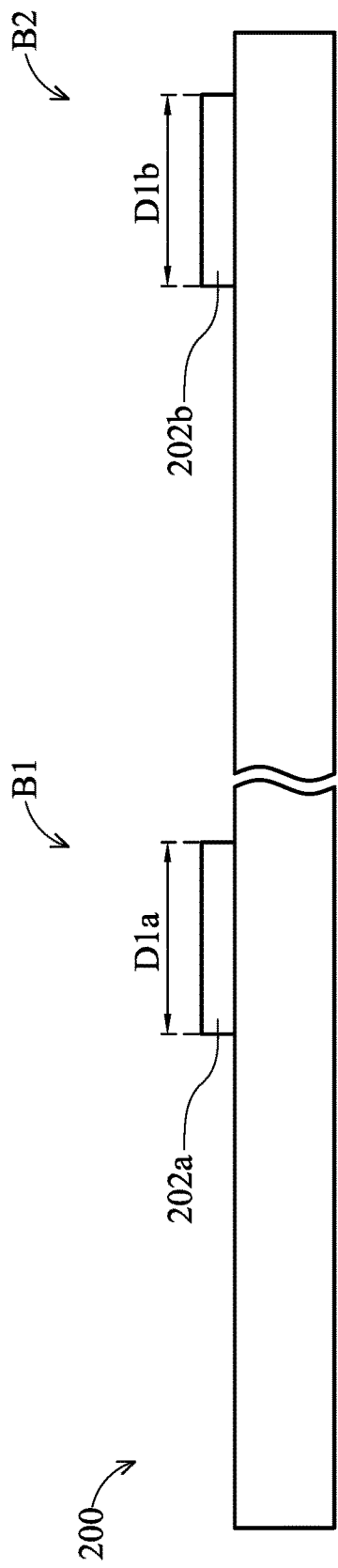

METHOD OF FORMING A SEMICONDUCTOR DEVICE INCLUDING STRAIN REDUCED STRUCTURE

PRIORITY CLAIM

The present application is a divisional of U.S. application Ser. No. 13/448,217, filed Apr. 16, 2012, which is incorporated herein by reference by its entirety.

BACKGROUND

The packaging of integrated circuit (IC) chips is one step in the manufacturing process, contributing to their overall cost, performance and reliability. As semiconductor devices reach higher levels of integration, packaging of an IC chip accounts for a considerable portion of the cost of producing the device, and failure of the package leads to costly yield reduction.

Several packaging technologies are available. For example, wire bonding technology uses upward-facing chips with wires connected to each pad on the chip. In flip chip technology, a flip chip microelectronic assembly includes a direct electrical connection of a downward-facing (that is, "flipped") chip onto a substrate, such as a printed circuit board (PCB) or a carrier using conductive pads of the chip.

Flip chips are typically made by placing solder balls on a silicon chip. Ball cracking is typically generated by strain caused by different coefficients of thermal expansion (CTE) between materials in the package assembly. For example, a silicon substrate of the chip typically has a CTE of higher than about 3 ppm/degree Celsius (° C.), a low-k dielectric of the chip typically has a CTE of higher than about 19 ppm/° C., while the package substrate typically has a CTE of higher than about 16 ppm/° C. The difference of CTEs introduces strain to the structure when a thermal change occurs.

BRIEF DESCRIPTION OF THE DRAWINGS

For a more complete understanding of the present disclosure, and the advantages thereof, reference is now made to the following descriptions taken in conjunction with the accompanying drawings, in which:

FIGS. 1d-1h are top views of regions of semiconductor dies of the semiconductor die structures of FIGS. 1a-1c;

FIG. 2 is a cross-sectional view of a substrate structure in accordance with various embodiments;

Corresponding numerals and symbols in the different figures generally refer to corresponding parts unless otherwise indicated. The figures are drawn to illustrate the relevant aspects of various embodiments and are not necessarily drawn to scale.

DETAILED DESCRIPTION

Figure 1A:
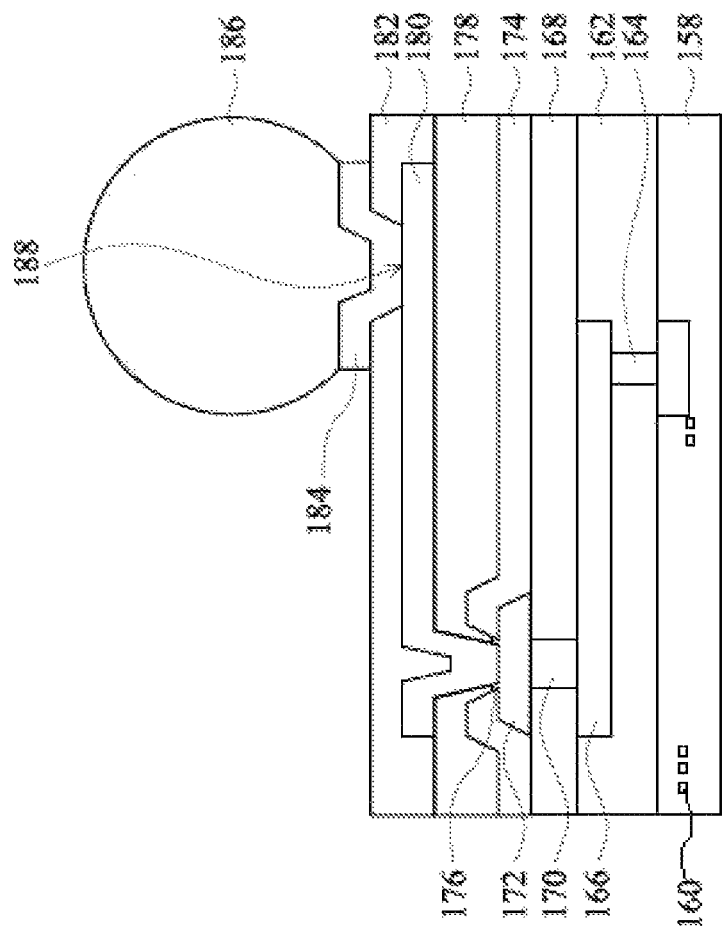
FIGS. 1a-1c are cross-sectional views of semiconductor die structures in accordance with various embodiments of the present disclosure.

The making and using of some embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to embodiments in a specific context, a package structure that uses one or more of solder balls, micro bumps, metal pillars (e.g., copper pillars), copper studs, gold studs or their combinations. The disclosure may also be applied, however, to a variety of packages of the semiconductor industry. It is understood that the following disclosure provides many different embodiments, or examples, for implementing different features. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Spatially relative terms, such as "below," "lower," "above," "upper", "over" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Flip chips are typically made by placing solder balls on a silicon chip. The balls are placed in an array on either one of the semiconductor die or the substrate for packaging. Conductive material other than solder balls are also used, including micro bumps, copper pillars, metal pillars, gold studs, copper studs, and combinations thereof. It is discovered that conductive material in different locations experience different amounts and types of strain. For example, conductive materials in peripheral regions of the semiconductor die experience higher strain during thermal cycling as compared to the material in the center of the die. Various embodiments of the present disclosure counteract this additional strain by varying the dimensions of the interface, or bond, between the semiconductor die and the packaging substrate. Particularly, a ratio of a bond width on the semiconductor die over a bond width on the substrate is changed in different regions of the device.

FIG. 1a is a cross-sectional view of a semiconductor die structure in accordance with various embodiments of the present disclosure. Referring to FIG. 1a, semiconductor die 100 comprises substrate 158. In some embodiments, semiconductor die 100 is rectangular or square. Substrate 158 may be a silicon substrate. In some embodiments, substrate 158 may be silicon-on-insulator, silicon carbide, III-V materials or sapphire. Substrate 158 may further comprise a variety of electrical circuits 160. Electrical circuits 160 formed on substrate 158 may be any type of circuitry suitable for a particular application. In certain embodiments, electrical circuits 160 may include various n-type metal-oxide semiconductor (NMOS) and/or p-type metal-oxide semiconductor (PMOS) devices made using high-k dielectric materials including hafnium silicate, zirconium silicate, hafnium dioxide and zirconium dioxide, or using multiple gate transistor designs such as fin field effect transistor (FinFET). Electrical circuits 160 may also include various n-type metal-oxide semiconductor (NMOS) and/or p-type metal-oxide semiconductor (PMOS) devices such as transistors, capacitors, resistors, diodes, photo-diodes, fuses and the like. Electrical circuits 160 may be interconnected to perform one or more functions. The functions include memory structures, processing structures, sensors, amplifiers, power distribution, input/output circuitry or the like.

Interlayer dielectric 162 is formed on electric circuits 160. Interlayer dielectric 162 may be formed of low-k dielectric materials, such as fluorine-doped silicon oxide with dielectric constant about 3.5~3.9. In other embodiments, low-k dielectric materials are formed of Hydrogen silsesquioxane (HSQ) or methylsilsesquioxane (MSQ) with dielectric constant is about 3.0. In some embodiments, low-k dielectric materials are formed of carbon-doped silicon oxide with dielectric constant of about 3.0. Still in other embodiments, low-k dielectric materials are formed of porous carbon-doped silicon oxide with dielectric constant of about 2.5. Yet in some embodiments, low-k dielectric materials may be formed of dielectric materials or porous dielectric materials commercially available under the trademark SiLK™ and having dielectric constant lower than about 2.6. Still in some embodiments, low-k dielectric materials may also be formed of porous silicon oxide with dielectric constant lower than about 2.0.

Referring to FIG. 1a, a plug 164 is formed of a metal, which may be titanium, titanium nitride, tungsten, aluminum, tantalum, copper or combinations thereof, in interlayer dielectric 162 and is coupled to electric circuits 160. Plug 164 is coupled to bottom metal layer 166, which is formed of copper, aluminum, tantalum, titanium, titanium nitride, tungsten, or combinations thereof and disposed in interlayer dielectric 162. Another interlayer dielectric 168 is disposed over the metal layer 166 and is formed of low-k dielectric materials similar to those discussed with respect to interlayer dielectric 162. Top plug 170 is disposed in interlayer dielectric 168 and is electrically connected to bottom metal layer 166. Top plug 170 is formed of a metal, which may be tungsten, copper, titanium nitride, tantalum, aluminum or alloy thereof. Top plug 170 is coupled to top metal layer 172, which is formed of aluminum, copper, titanium, titanium nitride, tungsten, or alloy thereof. While FIG. 1a shows bottom metal layer 166 and top metal layer 172, one skilled in the art will recognize that one or more interlayer dielectric layers (not shown), and the associated plug and metal layers (not shown) may be formed between bottom metal layer 166 and top metal layer 172.

A passivation layer 174 is formed on top metal layer 172. In some embodiments, passivation layer 174 is formed of non-organic materials such as un-doped silicate glass, silicon nitride, silicon oxide, silicon oxynitride, boron-doped silicon oxide, phosphorus-doped silicon oxide and the like. Opening 176 is formed to provide an external electrical connection. Opening 176 may be formed by photolithography and etch. A polymer layer 178 is formed on passivation layer 174. Polymer layer 178 is made of polymer materials such as epoxy, polyimide and the like. Polymer layer 178 may be made by any suitable method known in the art such as spin coating. Redistribution layer 180 is formed on polymer layer 178. Redistribution layer 180 may be made of metals such as titanium, titanium nitride, aluminum, tantalum, copper and combinations thereof. Redistribution layer 180 may be made by any suitable method known in the art such as sputter, CVD or electroplating. Redistribution layer 180 provides a conductive path between top metal layer 172 and top surface of the semiconductor die 100.

Another polymer layer 182 is formed on redistribution layer 180 and polymer layer 178. Polymer layer 182 is made of polymer materials such as epoxy, polyimide and the like. Polymer layer 182 may be made by any suitable method known in the art such as spin coating or lamination. Polymer layer 182 is patterned to form a plurality of openings. Bottom conductive pad 188 of redistribution layer 180 is exposed. Top conductive pad 184 is formed on polymer 182 and is coupled to bottom conductive pad 188. An electro-less (E-less) plating is performed to form top conductive pad 184. Top conductive pad 184 may have single-layer structure or composite structure including a plurality of sub-layers formed of different materials, and may comprise a layer(s) selected from the group consisting of titanium, nickel layer, palladium layer, gold layer, and combinations thereof. The formation methods may include immersion plating. In some embodiments, top conductive pad 184 is formed of electro-less nickel electro-less palladium immersion gold (ENEPIG), which includes nickel layer, palladium layer on the nickel layer, and gold layer on the palladium layer. Gold layer may be formed using immersion plating. In other embodiments, top conductive pad 184 may be formed of other materials and methods including, but not limited to, electro-less nickel immersion gold (ENIG), electro-less nickel electro-less palladium (ENEP), direct immersion gold (DIG), or the like.

Referring to FIG. 1a, conductive material 186 is formed on top conductive pad 184. Conductive material 186 is made of a solder ball, solder, a micro bump, a copper pillar, a metal pillar, a copper stud, a gold stud or combinations thereof. In some embodiments, a solder ball can be formed by commonly used methods such as ball transfer or ball placement. In other embodiments, conductive material 186 is made of a micro bump such as copper, tin, nickel, titanium, tantalum, solder, combinations thereof, and micro bump can be formed by photolithography and electroplating or plating. Still in further embodiments, conductive material 186 is made of a metal pillar such as titanium, tin, solder, copper, tantalum, nickel, combinations thereof, and the metal pillar can be formed by photolithography and electroplating or plating.

Figure 1B:
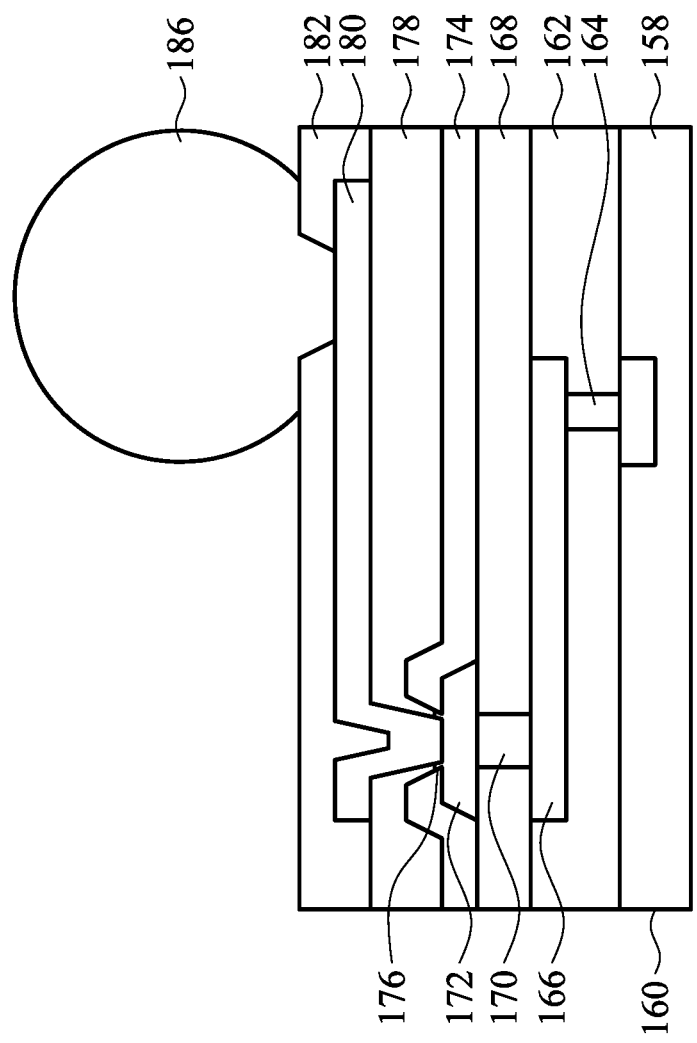

FIG. 1b shows another embodiment. In FIG. 1b, top conductive pad 184 of FIG. 1a is omitted. Conductive material 186 directly contacts the bottom of conductive pad 188.

Figure 1C:
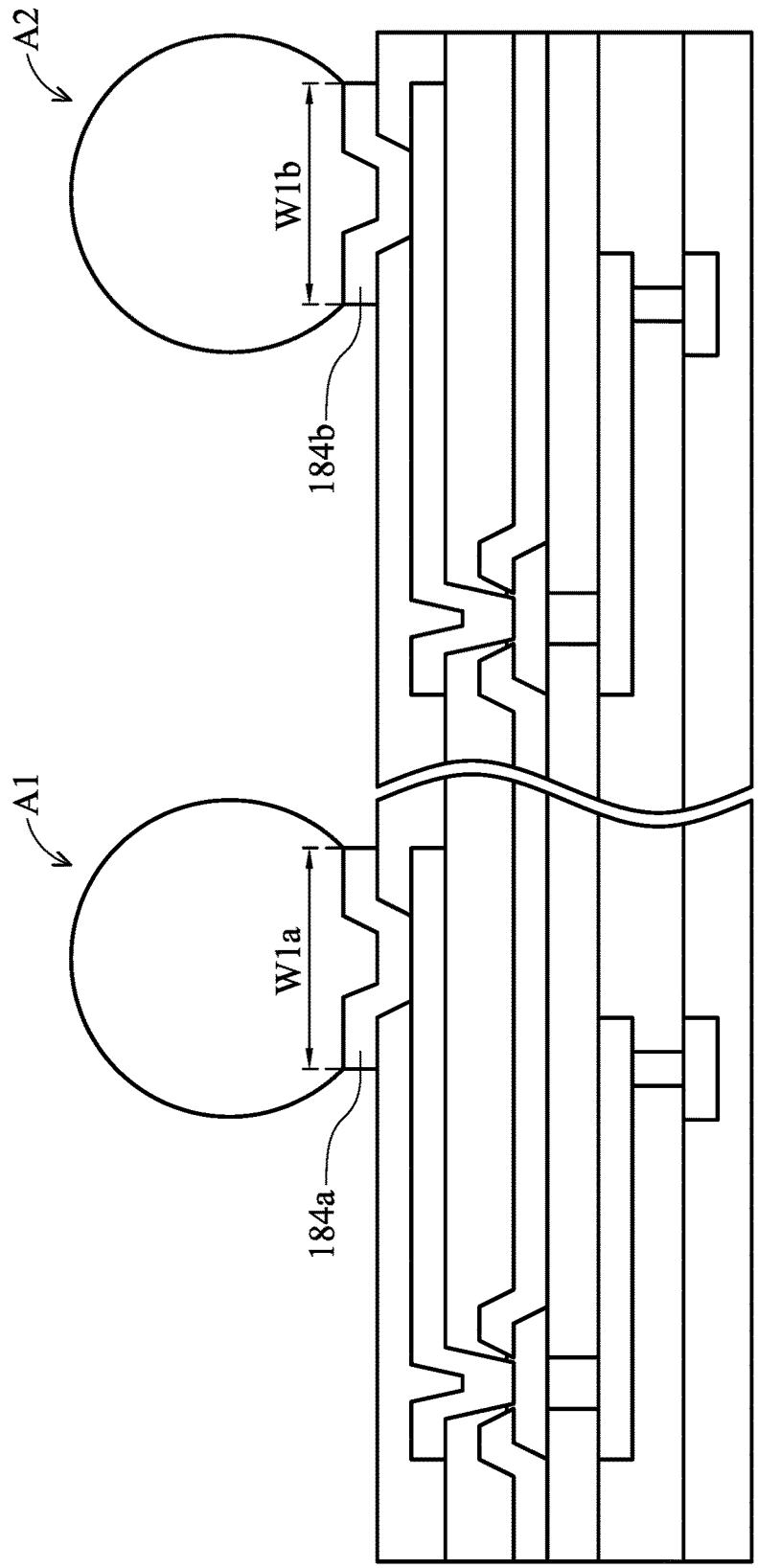

FIG. 1c shows two different combinations of top conductive pads and conductive materials with different dimensions on the same semiconductor die. Referring to FIG. 1c, top conductive pad 184a has width W1a in region A1 of semiconductor die 100 and top conductive pad 184b has width W1b in region A2 of semiconductor die 100. The width W1a is different from width W1b and the difference may be between about 4% and about 35%. The adjacent conductive materials in region A1 and region A2 may have same or different widths W1a and W1b. In some embodiments, the conductive material comprises a solder ball including about 94% to about 97% tin, about 3% to 5% silver, and 0.5% to about 2% copper. The size of the solder ball is between about 200 um and about 300 um. The adjacent balls may have same or different ball size. The pitch of solder ball is between about 400 um and about 600 um. The width W1a and width W1b is between about 100 um and about 300 um. In other embodiments, the conductive material comprises a metal pillar including titanium, tin, solder, copper, tantalum, nickel, combinations thereof. The size of a metal pillar, e.g., a copper pillar, is between about 20 um and about 100 um, and the pitch of copper pillar is between 40 um about and about 200 um. The width W1a and width W1b is between about 20 um and about 100 um. Still in other embodiments, the conductive material comprises a micro bump including copper, tin, nickel, titanium, tantalum, solder, combinations thereof. The size of the micro bump is between about 20 um and about 40 um. The pitch of micro bump is between about 40 um and about 80 um. The width W1a and width W1b is between about 20 um and about 40 um.

FIG. 1d shows a layout of top conductive materials on the semiconductor die. Referring to FIG. 1d, region D1 is an inner region and region D2 is an outer region. The semiconductor die has sides d1 and d2. Widths d3, d4, d5 and d6 are the widths of region D2. In some embodiments, the semiconductor die is a rectangle and the sides d3, d4, d5 and d6 are the same having a constant width. In some embodiments, d3 is the same as d5 and d4 is the same as d6. Still in certain embodiments, d3, d4, d5 and d6 are different. Yet in some embodiments, each of d3, d5, d4 and d6 is about less than 20% of the corresponding length d1 and d2. The number of top conductive materials (bumps, pillars, or balls) in region D2 may be fewer than about 30% of the total number of top conductive materials of the semiconductor die.

FIG. 1e shows another layout of top conductive materials on the semiconductor die. Referring to FIG. 1e, the semiconductor die has sides e1 and e2. Region E1 is an inner region and regions E2 are outer regions. Regions E2 include four corners of the semiconductor die. Each outer region E2 has widths e3 and e4 that are approximately equal to or less than 20% of the corresponding lengths e1 and e2. In some embodiments, the four outer regions E2 include different areas and may even have different shapes. For example, the outer regions E2 may even have different widths e3 and e4. In other embodiments, a number of top conductive materials of one outer region E2 is fewer than about 10% of the total number of top conductive materials of the semiconductor die. Still in other embodiments, the total number of top conductive materials at regions E2 is fewer than about 30% of the total number of top conductive materials of the semiconductor die.

FIG. 1f shows yet another layout of top conductive materials on the semiconductor die. Referring to FIG. 1f, region F1 is an inner region and region F2 is an outer region. Maximum radius r2 is located from a center point 140 of the semiconductor die an outermost top conductive material of the semiconductor die. Radius r1 is from the center point of the semiconductor die to a predefined conductive material, which may be located at any distance less than r2 from the center point 140 of the semiconductor die. Region F2 is disposed between a circle having radius r2 and a circle having radius r1. In some embodiments, r1 is about equal or less than ⅔ of r2. In some embodiments, the number of top conductive materials at region F2 is fewer than about 30% of the total number of top conductive materials of the semiconductor die. While the boundary formed by the circle having radius r1 crosses some top conductive materials, such a top conductive material belongs to either region F1 or F2 and is not split. In some embodiments, all top conductive materials on the r1 boundary are considered to be a part of region F1. In other embodiments, a top conductive material on the r1 boundary belongs to region F2.

Figure 1G:
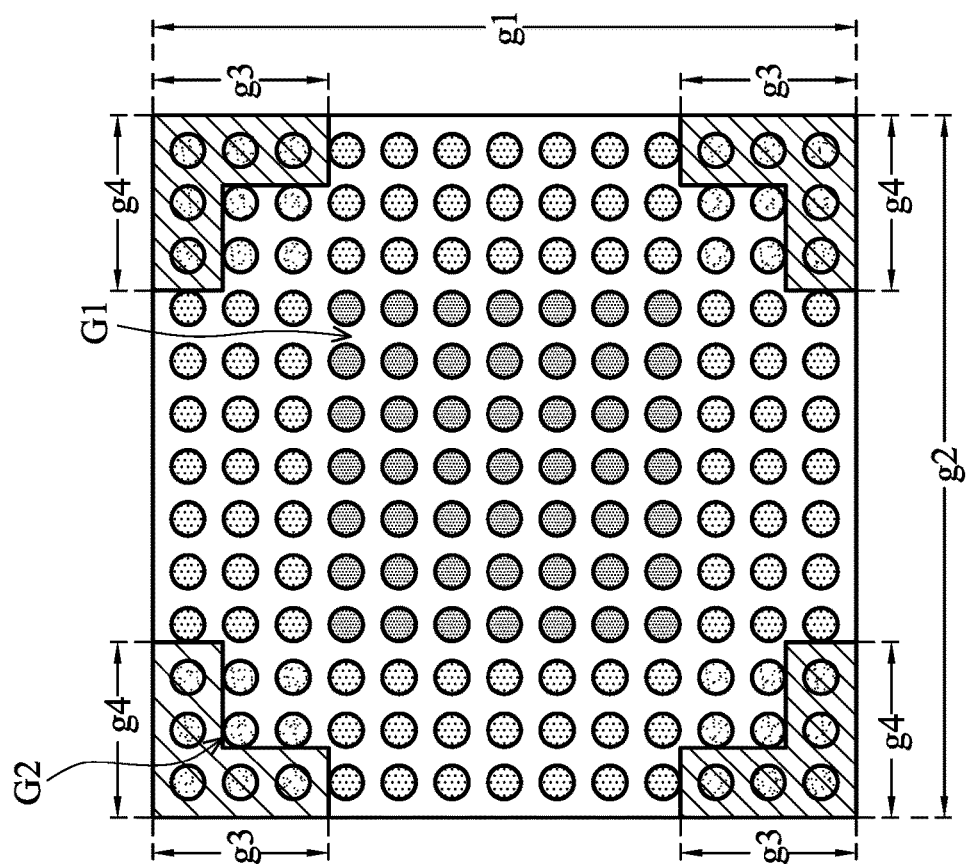

FIG. 1g yet shows another layout of top conductive materials on the semiconductor die. Referring to FIG. 1g, the semiconductor die has sides g1 and g2. Region G1 is an inner region and regions G2 are outer regions. Regions G2 include four L-shape corners. Each corner has widths g3 and g4, which are approximately equal to or are less than 20% of the corresponding length g1 and g2. In some embodiments, g3 and g4 have different lengths at each corner. In other embodiments, a number of top conductive materials at region G2 is fewer than about 30% of the total number of top conductive materials of the semiconductor die. Still in further embodiments, the number of top conductive materials of one corner is fewer than about 10% of the total number of top conductive materials of the semiconductor die.

Figure 1H:
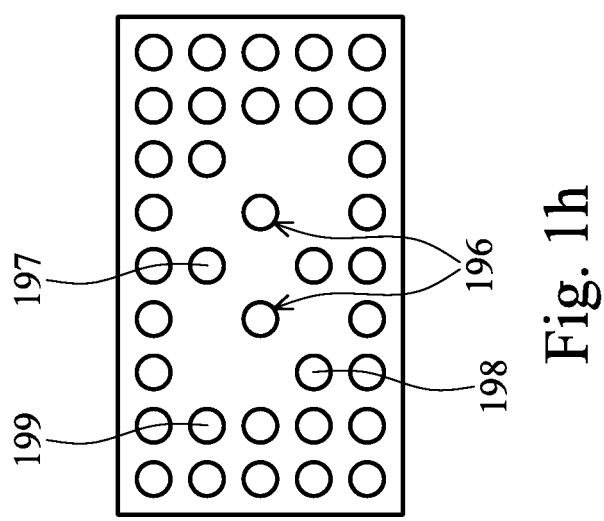

FIG. 1h, yet show other layout of top conductive materials on semiconductor die. Referring to FIG. 1h, isolated conductive materials (196, 197, 198, or 199) are located in an isolated region with low conductive material density. In other words, the pitch in isolated conductive material region is greater than the pitch in dense conductive material regions. In some embodiments, isolated conductive materials are those with "missing" neighboring conductive materials. In other words, if the entire array of conductive material were fully populated using the highest density region pitch, the empty area(s) adjacent and around an isolated conductive material would be additionally filled with one or more missing neighboring conductive material. Each isolated conductive material 196 has "missing" neighboring conductive materials at all four sides. In some embodiments, isolated conductive materials 196 and 197 are also defined as part of the isolated region because they have three or more "missing" neighboring conductive materials. In still other embodiments, other conductive materials with one or two "missing" neighboring conductive material, such as conductive material 198 (two "missing" neighboring conductive materials) or conductive material 199 (one "missing" neighboring conductive material), are considered to be a part of the isolated region.

FIG. 2 is cross-sectional view of a substrate structure in accordance with various embodiments. The substrate structure of FIG. 2 can form a device together with the semiconductor die of one or more of FIGS. 1a-1h. In some embodiments, substrate 200 is a print circuit board (PCB) and is made of epoxy, polymer, ceramic, benzocyclobutene (BCB), polybenzoxazole (PBO), and the like. In other embodiments, substrate 200 may be an interposer including silicon, glass or combinations thereof. In yet other embodiments, substrate 200 is another semiconductor die which may be identical to or different from semiconductor 100. Substrate 200 includes bonding pads 202a and 202b including titanium, copper, nickel, solder, tin, aluminum and alloys thereof. Bonding pad 202a has width D1a in region B1 and bonding pad 202b has width D1b in region B2. Width D1a is same as width D1b. In some embodiments, width D1a is different from width D1b.

Figure 3:
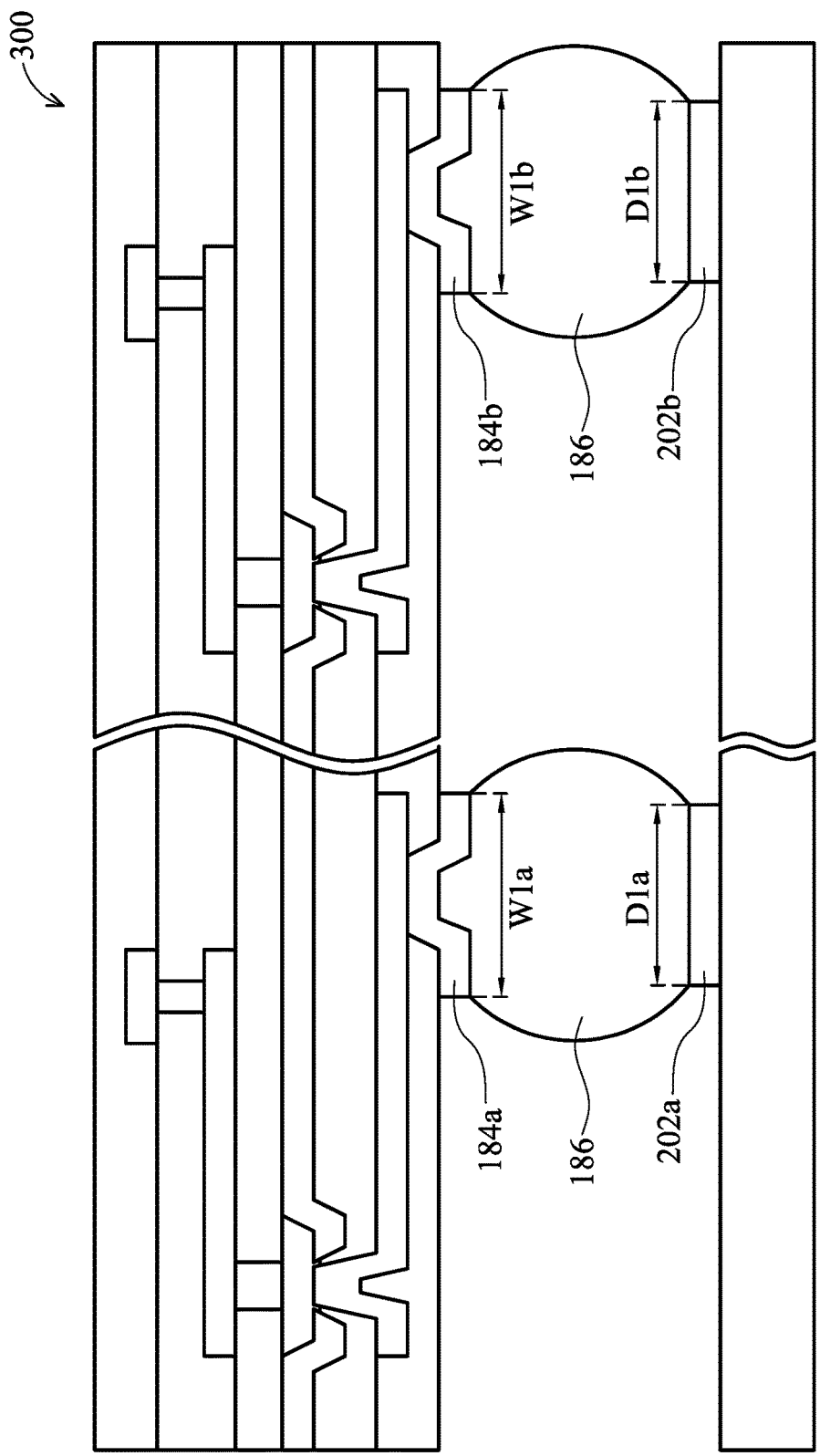
FIG. 3 is a cross-sectional view of a portion of a packaged semiconductor die with a substrate in accordance with various embodiments of the present disclosure.

Semiconductor die 100 as shown in one or more of FIGS. 1a-1h and substrate 200 as shown in FIG. 2 are integrated to form a device. The substrate 200 has corresponding inner and outer regions as discussed with respect to the semiconductor die 100. The device thus integrated also includes inner and outer regions and/or isolated and dense regions as discussed. Semiconductor die 100 is assembled facing down. As shown in FIG. 3, conductive material 186 couples conductive pad 184a and bonding pad 202a, as well as conductive pad 184b and bonding pad 202b. Flux may be applied either on semiconductor die 100 or substrate 200 prior to assembling them together. A reflow operation with a temperature between about 200° C. and about 300° C. is applied to form bonds between conductive pads on the die and corresponding bonding pads on the substrate.

Low-k dielectric materials are widely used in integrated circuits as inter-metal dielectric. Low-k dielectric material typically have lower strength and are sometimes porous, and therefore they are easier to be damaged or delaminated, especially when used together with high strength materials. The use of low-k dielectric materials in semiconductor dies may limit the usage of high strength underfill materials. It has been found that a number of samples failed during thermal cycle tests and cracks are typically formed close to the end having a smaller interface size. When tests are performed on samples with substantially balanced conductive material strain and dielectric strain, significant reliability improvements are found.

TABLE 1

| Ratio R | Conductive material strain | Dielectrics strain |
|---|---|---|
| 0.955 | 1.22 | 0.99 |
| 1.000 | 1.00 | 1.00 |
| 1.091 | 0.91 | 1.03 |
| 1.182 | 0.78 | 1.06 |
| 1.273 | 0.73 | 1.11 |
| 1.333 | 0.72 | 1.14 |
| 1.364 | 0.71 | 1.18 |

Referring to Table 1, ratio R is a ratio of the metal width of the conductive pad over the metal width of the bonding pad. For the device of FIG. 3, a first ratio R is width W1a of conductive pad 184a of semiconductor die 100 over width D1a of bonding pad 202a of substrate 200. A second ratio R is width W1b of conductive pad 184b of semiconductor 100 over width D1b of bonding pad 202b of substrate 200. Table 1 shows conductive material strain and dielectric strain simulated by ANSYS tool and normalized to ratio R of 1.000. It was discovered that the ratio R is highly correlated to conductive material strain and dielectric strain. When ratio R increases from 0.955 to 1.364, conductive material strain decreases from 1.22 to 0.71 and dielectric strain increases from 0.99 to 1.18. An effective range of ratio R may be specified in a region of acceptable conductive material strain and dielectric strain. High conductive material strain, for example, above 1.22 may induce fatigue or cracking during device operation. A small conductive material strain, approximately equal or less than 1.22, is thus specified. Higher dielectric strain can also induce failure of device, and smaller dielectric strain, approximately equal or less than 1.14, results in better device performance. Therefore, a ratio R between about 1.0 and about 1.3 is specified and results in better device performance.

It is believed that conductive materials at an outer region of a semiconductor die have larger conductive material strain than conductive materials at an inner region of the semiconductor die. An arrangement of different ratios R at the outer region and the inner region can balance conductive material strain. According to various embodiments, ratio R at the inner region is smaller than ratio R at the outer region to counter primarily the effects of higher conductive material strain, as long as the dielectric strain remains within an acceptable range.

Referring to FIG. 1d, a ratio R1 of a bond at region D1 is smaller than another ratio R2 of a bond at region D2 to balance conductive material strain and dielectric strain on a semiconductor die, the ratio R2 is between about 1.0 and about 1.3, and the ratio R1 is less than R2 and is about 1.0. In some embodiments, the ratio R1 may be a gradient, increasing outwardly toward the outer region of the semiconductor die. In other embodiments, the ratio R2 may be a gradient, increasing from conductive materials close to the inner region toward the outermost conductive materials.

Referring to FIG. 1e, a ratio R3 of a bond at region E1 is smaller than another ratio R4 of a bond at region E2 to balance conductive material strain and dielectric strain on a semiconductor die. The ratio R4 is greater than R3 and is between about 1.0 and about 1.3. The ratio R3 is about 1.0. In some embodiments, the ratio R4 may have the same value or different values at four corners. In further embodiments, the ratio R4 may have a different value for each bond at one corner.

Referring to FIG. 1f, a ratio R5 of a bond at region F1 is smaller than another ratio R6 of a bond at region F2 to balance conductive material strain and dielectric strain on a semiconductor die. The ratio R6 is greater than about 1.0 up to about 1.3, and the ratio R5 is about 1.0.

Referring to FIG. 1g, a ratio R7 of a bond at region G1 is smaller than another ratio R8 of a bond at region G2 to balance conductive material strain and dielectric strain on a semiconductor die. The ratio R8 is between about 1.0 and about 1.3, and the ratio R7 is about 1.0. In some embodiments, the ratio R8 may have the same value or different values at four corners. In further embodiments, the ratio R8 may have a different value for each bond at one corner.

Referring to FIG. 1h, a ratio R9 of a bond for the isolated region (e.g., the region including conductive materials 196 in some embodiments, and additionally one or more of conductive materials 197, 198, and 199 in further embodiments) is larger than another ratio of other bonds in dense regions outside the isolated region. The ratio R9 is between about 1.0 and about 1.3. In some embodiments, the ratio R9 may be the same or different for each isolated conductive material.

Figure 4:
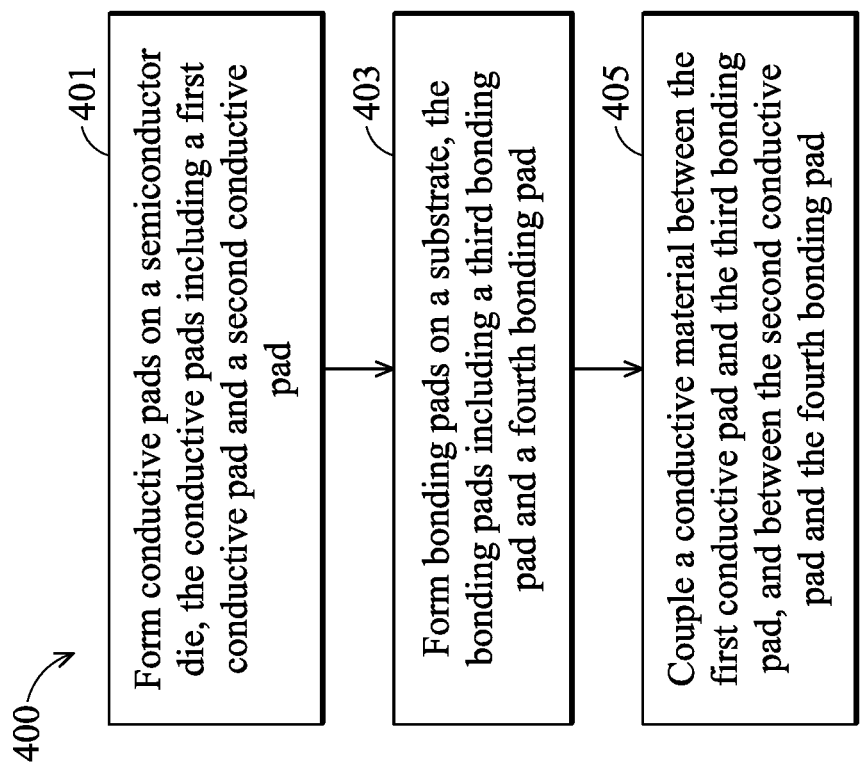
FIG. 4 is a flow chart for a method of packaging a semiconductor die and a substrate in accordance with various embodiments of the present disclosure.

FIG. 4 is a flowchart of a method 400 described above in association with FIGS. 1-3. The method begins at operation 401 by forming conductive pads on a semiconductor die, the conductive pads including a first conductive pad and a second conductive pad. The first conductive pad and the second conductive pad have a first width and a second width respectively. At operation 403, bonding pads are formed on a substrate and the bonding pads including a third bonding pad and a fourth bonding pad. The third bonding pad and the fourth bonding pad have a third width and a fourth width. At operation 405, conductive material couples between the first conductive pad and the third bonding pad, and between the second conductive pad and the fourth bonding pad. A ratio of the first width of the first conductive pad to the third width of the third bonding pad is different from an another ratio of the second width of the second conductive pad to the fourth width of the fourth bonding pad.

In some embodiments, a device includes a semiconductor die and a substrate. The semiconductor die includes a first pad with a first width on a first region of the semiconductor die and a second pad with a second width on a second region of the semiconductor die. The substrate includes a third pad with a third width on a third region of the substrate and a fourth pad with a fourth width on a fourth region of the substrate. A conductive material couples between the first pad and the third pad, and between the second pad and the fourth pad. A ratio of the first width of the first pad to the third width of the third pad is smaller than another ratio of the second width of the second pad to the fourth width of the fourth pad.

In some embodiments, a device includes a semiconductor die and a substrate. The semiconductor die is coupled to the substrate by a plurality of conductive materials. Each conductive material couples a conductive pad with a first width on the semiconductor die and a bonding pad with a second width on the substrate, and is defined by a ratio of the first width to the second width. The ratio for a conductive material further from a center of the device is larger than the ratio for a conductive material closer to the center of the device.

In some embodiments, a device includes a semiconductor die and a substrate. The semiconductor includes a first pad with a first width on an isolated region of the semiconductor die. The substrate includes a second pad with a second width on an isolated region of the substrate. A conductive material is coupled between the first pad and the second pad. A ratio of the first width of the first pad to the second width of the second pad is between about 1.0 and about 1.3.

In some embodiments, a method is provided to form a device from a semiconductor die and a substrate. Conductive pads are formed on a semiconductor die. The conductive pads include a first conductive pad with a first width on a first region of the semiconductor die and a second conductive pad with a second width on a second region of the semiconductor die. Bonding pads is formed on a substrate. The bonding pads includes a third bonding pad with a third width on a third region of the substrate and a fourth bonding pad with a fourth width on a fourth region of the substrate. A conductive material is coupled between the first conductive pad and the third bonding pad, and between the second conductive pad and the fourth bonding pad. A ratio of the first width of the first conductive pad to the third width of the third bonding pad is different from another ratio of the second width of the second conductive pad to the fourth width of the fourth bonding pad.

One aspect of this description relates to a method of forming a device. The method includes forming conductive pads on a semiconductor die. The conductive pads include a first conductive pad having a first width on a first region of the semiconductor die; and a second conductive pad having a second width on a second region of the semiconductor die. The method further includes forming bonding pads on a substrate. The bonding pads include a third bonding pad having a third width on a third region of the substrate; and a fourth bonding pad having a fourth width on a fourth region of the substrate. The method further includes forming a conductive material coupled between the first conductive pad and the third bonding pad, and between the second conductive pad and the fourth bonding pad. A ratio A of the first width of the first conductive pad to the third width of the third bonding pad is different from a ratio B of the second width of the second conductive pad to the fourth width of the fourth bonding pad. In some embodiments, the ratio B is between 1 and about 1.3, and the ratio B is greater than the ratio A. In some embodiments, the conductive material comprises at least one solder ball formed by ball placement, ball transfer or a combination thereof. In some embodiments, the conductive material is copper and formed by electroplating or plating. In some embodiments, the second region is an isolated region of the semiconductor die; and the fourth region is an isolated region of the substrate corresponding to the isolated region of the semiconductor die.

Another aspect of this description relates to a method of forming a semiconductor device. The method includes depositing a first redistribution layer (RDL) over a substrate. The method further includes depositing a second RDL over the substrate. The method further includes plating a first contact pad over the first RDL, wherein the first contact pad has a first width. The method further includes plating a second contact pad over the second RDL, wherein the second contact pad has a second width. The method further includes forming a first bonding pad over a die, wherein the first bonding pad has a third width, and ratio A is a ratio of the first width to the third width. The method further includes forming a second bonding pad over the die, wherein the second bonding pad has a fourth width, ratio B is a ratio of the second width to the fourth width, and ratio A is different from ratio B. The method further includes bonding the first contact pad to the first bonding pad. The method further includes bonding the second contact pad to the second bonding pad. In some embodiments, the plating of the second contact pad includes plating the second contact pad have the second width different from the first width. In some embodiments, the plating of the second contact pad includes plating the second contact pad to have a difference between the second width and the first width range from about 4% to about 35%. In some embodiments, the depositing of the second RDL over the substrate includes depositing the second RDL at a location farther from a center of the substrate than the first RDL. In some embodiments, the forming of the second bonding pad includes forming the second bonding pad have the fourth width different from the third width. In some embodiments, the forming of the second bonding pad includes forming the second bonding pad have the fourth width equal to the third width. In some embodiments, the bonding of the first contact pad to the first bonding pad is performed simultaneously with the bonding of the second contact pad to the second bonding pad. In some embodiments, the bonding of the first contact pad to the first bonding pad comprises a reflow operation.

Still another aspect of this description relates to a method of forming a semiconductor device. The method includes plating a plurality of first contact pads over a first region of a substrate, wherein each first contact pad of the plurality of first contact pads has a first width. The method further includes plating a plurality of second contact pads over a second region of the substrate, wherein each second contact pad of the plurality of second contact pads has a second width. The method further includes forming a plurality of first bonding pads over a die, wherein each first bonding pad of the plurality of first bonding pads has a third width, and ratio A is a ratio of the first width to the third width. The method further includes forming a plurality of second bonding pads over the die, wherein each second bonding pad of the plurality of second bonding pads has a fourth width, ratio B is a ratio of the second width to the fourth width, and ratio A is different from ratio B. The method further includes bonding at least one first contact pad of the plurality of first contact pads to at least one first bonding pad of the plurality of first bonding pads. The method further includes bonding at least one second contact pad of the plurality of second contact pads to at least one second bonding pad of the plurality of second bonding pads. In some embodiments, the plating of the plurality of first contact pads includes plating a first number of first contact pads greater than a number of second contact pads in the plurality of second contact pads. In some embodiments, the plating of the plurality of second contact pads includes plating the plurality of second contact pads surrounding the first region of the substrate. In some embodiments, the plating of the plurality of second contact pads includes plating the plurality of second contact pads in a location having a higher strain than the first region of the substrate following the bond of the at least one second contact pad to the at least one second bonding pad. In some embodiments, the plating of the plurality of first contact pads includes plating the plurality of first contact pads having a first pitch different from a second pitch between adjacent second contact pads of the plurality of second contact pads. In some embodiments, the bonding of the at least one first contact pad to the at least one first bonding pad comprises bonding the at least one first contact pad to the at least one first bonding pad using a solder ball. In some embodiments, the bonding of the at least one first contact pad to the at least one first bonding pad includes bonding the at least one first contact pad to the at least one first bonding pad using a copper pillar.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a device, the method comprising:
   forming conductive pads on a semiconductor die, the conductive pads including
      a first conductive pad having a first width on a first region of the semiconductor die; and
      a second conductive pad having a second width on a second region of the semiconductor die;
   forming bonding pads on a substrate, the bonding pads including
      a third bonding pad having a third width on a third region of the substrate; and
      a fourth bonding pad having a fourth width on a fourth region of the substrate; and
   forming a conductive material coupled between the first conductive pad and the third bonding pad, and between the second conductive pad and the fourth bonding pad, wherein a ratio A of the first width of the first conductive pad to the third width of the third bonding pad is different from a ratio B of the second width of the second conductive pad to the fourth width of the fourth bonding pad.

2. The method of claim 1, wherein the ratio B is between 1 and about 1.3, and the ratio B is greater than the ratio A.

3. The method of claim 1, wherein the conductive material comprises at least one solder ball formed by ball placement, ball transfer or a combination thereof.

4. The method of claim 1, wherein the conductive material is copper and formed by electroplating or plating.

5. The method of claim 1, wherein
   the second region is an isolated region of the semiconductor die; and
   the fourth region is an isolated region of the substrate corresponding to the isolated region of the semiconductor die.

6. A method of forming a semiconductor device, the method comprising:
   depositing a first redistribution layer (RDL) over a substrate;
   depositing a second RDL over the substrate;
   plating a first contact pad over the first RDL, wherein the first contact pad has a first width;
   plating a second contact pad over the second RDL, wherein the second contact pad has a second width;
   forming a first bonding pad over a die, wherein the first bonding pad has a third width, and ratio A is a ratio of the first width to the third width;
   forming a second bonding pad over the die, wherein the second bonding pad has a fourth width, ratio B is a ratio of the second width to the fourth width, and ratio A is different from ratio B;
   bonding the first contact pad to the first bonding pad; and
   bonding the second contact pad to the second bonding pad.

7. The method of claim 6, wherein the plating of the second contact pad comprises plating the second contact pad have the second width different from the first width.

8. The method of claim 6, wherein the plating of the second contact pad comprises plating the second contact pad to have a difference between the second width and the first width range from about 4% to about 35%.

9. The method of claim 6, wherein the depositing of the second RDL over the substrate comprises depositing the second RDL at a location farther from a center of the substrate than the first RDL.

10. The method of claim 6, wherein the forming of the second bonding pad comprises forming the second bonding pad have the fourth width different from the third width.

11. The method of claim 6, wherein the forming of the second bonding pad comprises forming the second bonding pad have the fourth width equal to the third width.

12. The method of claim 6, wherein the bonding of the first contact pad to the first bonding pad is performed simultaneously with the bonding of the second contact pad to the second bonding pad.

13. The method of claim 12, wherein the bonding of the first contact pad to the first bonding pad comprises a reflow operation.

14. A method of forming a semiconductor device, the method comprising:
   plating a plurality of first contact pads over a first region of a substrate, wherein each first contact pad of the plurality of first contact pads has a first width;
   plating a plurality of second contact pads over a second region of the substrate, wherein each second contact pad of the plurality of second contact pads has a second width;
   forming a plurality of first bonding pads over a die, wherein each first bonding pad of the plurality of first bonding pads has a third width, and ratio A is a ratio of the first width to the third width;
   forming a plurality of second bonding pads over the die, wherein each second bonding pad of the plurality of second bonding pads has a fourth width, ratio B is a ratio of the second width to the fourth width, and ratio A is different from ratio B;

bonding at least one first contact pad of the plurality of first contact pads to at least one first bonding pad of the plurality of first bonding pads; and bonding at least one second contact pad of the plurality of second contact pads to at least one second bonding pad of the plurality of second bonding pads.

15. The method of claim 14, wherein the plating of the plurality of first contact pads comprises plating a first number of first contact pads greater than a number of second contact pads in the plurality of second contact pads.

16. The method of claim 14, wherein the plating of the plurality of second contact pads comprises plating the plurality of second contact pads surrounding the first region of the substrate.

17. The method of claim 14, wherein the plating of the plurality of second contact pads comprises plating the plurality of second contact pads in a location having a higher strain than the first region of the substrate following the bond of the at least one second contact pad to the at least one second bonding pad.

18. The method of claim 14, wherein the plating of the plurality of first contact pads comprises plating the plurality of first contact pads having a first pitch different from a second pitch between adjacent second contact pads of the plurality of second contact pads.

19. The method of claim 14, wherein the bonding of the at least one first contact pad to the at least one first bonding pad comprises bonding the at least one first contact pad to the at least one first bonding pad using a solder ball.

20. The method of claim 14, wherein the bonding of the at least one first contact pad to the at least one first bonding pad comprises bonding the at least one first contact pad to the at least one first bonding pad using a copper pillar.

* * * * *